US008996952B2

(12) United States Patent
Li et al.

(10) Patent No.: US 8,996,952 B2
(45) Date of Patent: Mar. 31, 2015

(54) HIGH-THROUGHPUT ITERATIVE DECODING'S DEFECT SCAN IN RETRY MODE OF STORAGE SYSTEM CHANNEL

(71) Applicant: Marvell World Trade Ltd., St. Michael (BB)

(72) Inventors: Shu Li, San Jose, CA (US); Yifei Zhang, Milpitas, CA (US); Panu Chaichanavong, Sunnyvale, CA (US); Naim Siemsen-Schumann, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 98 days.

(21) Appl. No.: 13/723,050

(22) Filed: Dec. 20, 2012

(65) Prior Publication Data

US 2013/0173990 A1 Jul. 4, 2013

Related U.S. Application Data

(60) Provisional application No. 61/583,135, filed on Jan. 4, 2012.

(51) Int. Cl.
*G11C 29/00* (2006.01)
*H03M 13/03* (2006.01)
*G06F 11/10* (2006.01)
(Continued)

(52) U.S. Cl.
CPC ........... *G06F 11/10* (2013.01); *H03M 13/2957* (2013.01); *H03M 13/373* (2013.01); *H03M 13/3746* (2013.01); *H03M 13/6343* (2013.01); *G11B 20/1833* (2013.01); *H03M 13/3972* (2013.01); *G11B 2020/185* (2013.01); *G11B 2220/2516* (2013.01)

USPC ........................................... 714/763; 714/794

(58) Field of Classification Search
None
See application file for complete search history.

(56) References Cited

U.S. PATENT DOCUMENTS 6,711,225 B1    3/2004  Sutardja et al.
7,266,750 B1    9/2007  Patapoutian et al.
(Continued)

FOREIGN PATENT DOCUMENTS

EP    1267346    12/2002

OTHER PUBLICATIONS

Pozzi, Christian, Authorized Officer, European Patent Office, International Search Report for International Application No. PCT/IB2012/057757, dated Apr. 15, 2013, 17 pages.
(Continued)

*Primary Examiner* — Daniel McMahon

(57) ABSTRACT

The present disclosure includes systems and techniques relating to decoding signals produced within a storage device. A described technique includes retrieving a first codeword from a storage medium, decoding the first codeword, performing a retry process when the decoding was not successful, and retrieving one or more second codewords from the storage medium during the retry process to at least maintain a drive throughput. The retry process can include identifying one or more data chunks within the first codeword having potential defects, generating an erasure mask based on the one or more data chunks, applying, based on a window, one or more erasures within one or more different regions of the first codeword based on one or more corresponding regions of the erasure mask to produce one or more versions of the first codeword, and decoding the one or more versions of the first codeword.

12 Claims, 8 Drawing Sheets

(51) Int. Cl.
*H03M 13/29* (2006.01)
*H03M 13/37* (2006.01)
*H03M 13/00* (2006.01)
*G11B 20/18* (2006.01)
*H03M 13/39* (2006.01)

(56) References Cited

U.S. PATENT DOCUMENTS

| | | | |
|---|---|---|---|
| 7,453,960 B1 | 11/2008 | Wu et al. | |
| 7,467,347 B2 | 12/2008 | Orio | |
| 7,484,158 B2 | 1/2009 | Sharon et al. | |
| 7,571,375 B2 | 8/2009 | Kim et al. | |
| 7,583,751 B1 | 9/2009 | Burd et al. | |
| 7,911,364 B1 | 3/2011 | Zhang et al. | |
| 7,984,367 B1 | 7/2011 | Chaichanavong et al. | |
| 8,032,812 B1* | 10/2011 | Yang et al. | 714/755 |
| 8,046,660 B2* | 10/2011 | Wu et al. | 714/755 |
| 8,074,151 B1* | 12/2011 | Burd et al. | 714/784 |
| 8,230,312 B1 | 7/2012 | Yeo et al. | |
| 2005/0120286 A1 | 6/2005 | Akamatsu | |
| 2005/0190477 A1 | 9/2005 | Taguchi et al. | |
| 2005/0262423 A1* | 11/2005 | Liu et al. | 714/798 |
| 2006/0156171 A1 | 7/2006 | Kuznetsov et al. | |
| 2007/0283220 A1 | 12/2007 | Kim | |
| 2008/0052595 A1 | 2/2008 | Haratsch et al. | |
| 2008/0235561 A1 | 9/2008 | Yang | |
| 2008/0276156 A1* | 11/2008 | Gunnam et al. | 714/801 |
| 2008/0282129 A1 | 11/2008 | Blanksby | |
| 2009/0019335 A1 | 1/2009 | Boyer et al. | |
| 2009/0150746 A1 | 6/2009 | Chaichanavong et al. | |
| 2009/0235146 A1* | 9/2009 | Tan et al. | 714/780 |
| 2009/0268575 A1* | 10/2009 | Tan et al. | 369/53.41 |
| 2010/0229031 A1* | 9/2010 | Tan et al. | 714/6 |
| 2011/0060973 A1 | 3/2011 | Yang et al. | |
| 2011/0185264 A1 | 7/2011 | Zeng et al. | |
| 2013/0343496 A1* | 12/2013 | Eliaz et al. | 375/341 |
| 2014/0153625 A1* | 6/2014 | Vojcic et al. | 375/224 |

OTHER PUBLICATIONS

Yeo et al., "Iterative Decoder Architectures," *Capacity Approaching Codes, Iterative Decoding Algorithms, and their Applications, IEEE Communications Magazine*, vol. 41, No. 8, pp. 132-140, Aug. 2003.

Mansour et al., "Memory-Efficient Turbo Decoder Architectures for LDPC Codes," *IEEE Journal of Solid-State Circuits*, vol. 41, No. 3, pp. 684-698, Mar. 2006.

Luby et al., "Improved Low-Density Parity-Check Codes Using Irregular Graphs", IEEE Transactions on Information Theory, vol. 47(2), pp. 585-598, Feb. 2001.

Richardson et al., "The Capacity of Low-Density Parity-Check Codes Under Message-Passing Decoding", IEEE Transactions on Information Theory, vol. 47, Feb. 2001, 599-618.

Richardson et al., "Design of capacity-approaching irregular low-density parity-check codes," IEEE Transactions on Information Theory, vol. 47, pp. 619-637, Feb. 2001.

Kavcic et al., "Binary ISI Channels: Gallager Codes, Density Evolution and Code Performance Bounds", IEEE Transactions on Information Theory, Jul. 2003, 100-118.

\* cited by examiner

HIGH-THROUGHPUT ITERATIVE DECODING'S DEFECT SCAN IN RETRY MODE OF STORAGE SYSTEM CHANNEL

CROSS REFERENCE TO RELATED APPLICATIONS

This application claims the benefit of the priority of U.S. Provisional Application Ser. No. 61/583,135 filed Jan. 4, 2012 and entitled "High-throughput Iterative Decoding's Defect Scan in Retry Mode of storage system channel." The disclosures of the above application is incorporated herein by reference in its entirety.

BACKGROUND

Storage devices, such as a magnetic medium based disk drive, can store data on circular, concentric tracks on a disk surface. A disk drive uses one or more clock signals for drive operations such as read and write operations. A drive head, in the disk drive, retrieves and records data on a rotating disk as the head flies on a cushion of air over the disk surface. When retrieving data, magnetic field variations are converted into an analog electrical signal, the analog signal is amplified, converted to a digital signal, and interpreted. A drive head can include a read head and a write head.

SUMMARY

The present disclosure includes systems and techniques for decoding signals produced within storage devices, such as a hard disk drive.

According to an aspect of the present disclosure, a technique for operating a storage device includes retrieving a first codeword from a storage medium; decoding the first codeword; performing a retry process when the decoding was not successful; and retrieving one or more second codewords from the storage medium during the retry process to at least maintain a drive throughput, where the one or more second codewords are different from the first codeword, and the first codeword is not retrieved from the storage medium during the retry process. The retry process can include identifying one or more data chunks within the first codeword having potential defects; generating an erasure mask based on the one or more data chunks; applying, based on a window, one or more erasures within one or more different regions of the first codeword based on one or more corresponding regions of the erasure mask to produce one or more versions of the first codeword; and decoding the one or more versions of the first codeword.

Implementations based on the technique can include one or more of the following features. The retry process can include iteratively moving the window from a start location to an end location based on a window length parameter and a stepping size parameter, where each placement of the window corresponds to one of the one or more regions of the first codeword. Decoding the one or more versions of the first codeword can include iteratively processing codeword information and exchanging information between a path decoder and a code decoder. Decoding the one or more versions of the first codeword can include applying the one or more erasures. Applying the one or more erasures can include producing modified log-likelihood-ratio (LLR) information by setting to zero one or more LLR values, the one or more LLR values being produced by the path decoder. The code decoder can be configured to receive the modified LLR information from the path decoder. The path decoder can include a soft output Viterbi algorithm (SOVA) decoder. The code decoder can include a low density parity check (LDPC) decoder.

Another example of a technique for operating a storage device includes retrieving a first codeword from a storage medium; decoding the first codeword; and performing a retry process when the decoding was not successful, the retry process including identifying one or more data chunks within the first codeword having potential defects; generating an erasure mask based on the one or more data chunks; applying, based on a window, one or more erasures within one or more different regions of the first codeword based on one or more corresponding regions of the erasure mask to produce one or more versions of the first codeword; and decoding the one or more versions of the first codeword.

The described systems and techniques can be implemented in electronic circuitry, computer hardware, firmware, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

A storage system can include a storage medium and a controller. The controller can be configured to process information retrieved from the storage medium, the information including a first codeword, identify one or more data chunks within the first codeword having potential defects, generate an erasure mask based on the one or more data chunks, decode the first codeword, selectively perform a retry process when the decoding was not successful, and selectively retrieve one or more second codewords from the storage medium during the retry process to at least maintain a drive throughput, where the one or more second codewords are different from the first codeword, and where the first codeword is not retrieved from the storage medium during the retry process. The retry process can include accessing at least a portion of the first codeword, applying, based on a window, one or more erasures within one or more different regions of the codeword based on one or more corresponding regions of the erasure mask to produce one or more versions of the first codeword, and decoding the one or more versions of the first codeword.

A storage apparatus can include an interface configured to communicate with a host, a memory structure configured to store information retrieved from a storage medium, the information including a first codeword, circuitry configured to identify one or more data chunks within the first codeword having potential defects, and generate an erasure mask based on the one or more data chunks, and circuitry configured to decode the first codeword, selectively perform a retry process that is independent of the host when the decoding was not successful, and selectively retrieve one or more second codewords from the storage medium during the retry process to at least maintain a drive throughput.

Particular embodiments of the technology described in this document can be implemented so as to realize one or more of the following advantages. One or more described technologies can increase the throughput of a drive by not requiring external or host involvement during a retry process. Additional codewords can be retrieved during a retry process to at least maintain a drive throughput. Producing one or more versions of a codeword in a retry process by accessing a memory structure that stores the codeword instead of re-retrieving the codeword from the medium can increase drive throughput. Selectively applying erasures within a codeword can increase the performance of a decoder. An internal defect scan procedure with a finer defined moving window can replace an external programming defect erase procedure.

Details of one or more implementations are set forth in the accompanying drawings and the description below. Other features and advantages may be apparent from the description and drawings, and from the claims.

DRAWING DESCRIPTIONS

Like reference symbols in the various drawings indicate like elements.

DETAILED DESCRIPTION

A storage system such as a hard disk drive (HDD) or an optical disk drive (ODD) may employ encoding and decoding techniques to compensate for a noisy channel. For example, dust or debris on a disk surface or on an associated read head may introduce defects in a read signal produced by the read head. In some cases, a writing process is not able to accurately write data to the disk surface due to a transient event such as dust or debris present during the write. Further, an abnormality on, or physical damage to, the disk surface may permanently cause read signals with defects to be produced. Thus, a storage system can use encoding and decoding techniques to improve the chances of successful data retrieval from the storage medium.

Storage systems can read and write codewords to a medium such as a disk, where each codeword includes multiple symbols. In some implementations, a symbol can represent one or more bit-values. Moreover, these symbols can be grouped into data chunks. A reading process can sample a read signal produced by a read head to generate samples. The reading process can group samples, which correspond to the same codeword, into a codeword vector. In some cases, one or more chunks of the codeword vector may have defects. Storage system can employ a technique to identify one or more chunks that may have potential defects, i.e., suspicious data. Potential interference from such suspicious data may impede codeword decoding and could even result in a complete failure to decode the codeword. A defect identification technique, for example, can output a confidence value for each chunk, and those chunks having a low confidence value can be identified as having one or more potential defects. Chunks having suspicious data can be selectively erased using a movable window during a retry process to improve decoding performance without re-retrieving the codeword from the medium. Retrying without re-retrieving can enable the storage system to continue retrieving data associated with other codewords.

Figure 1:
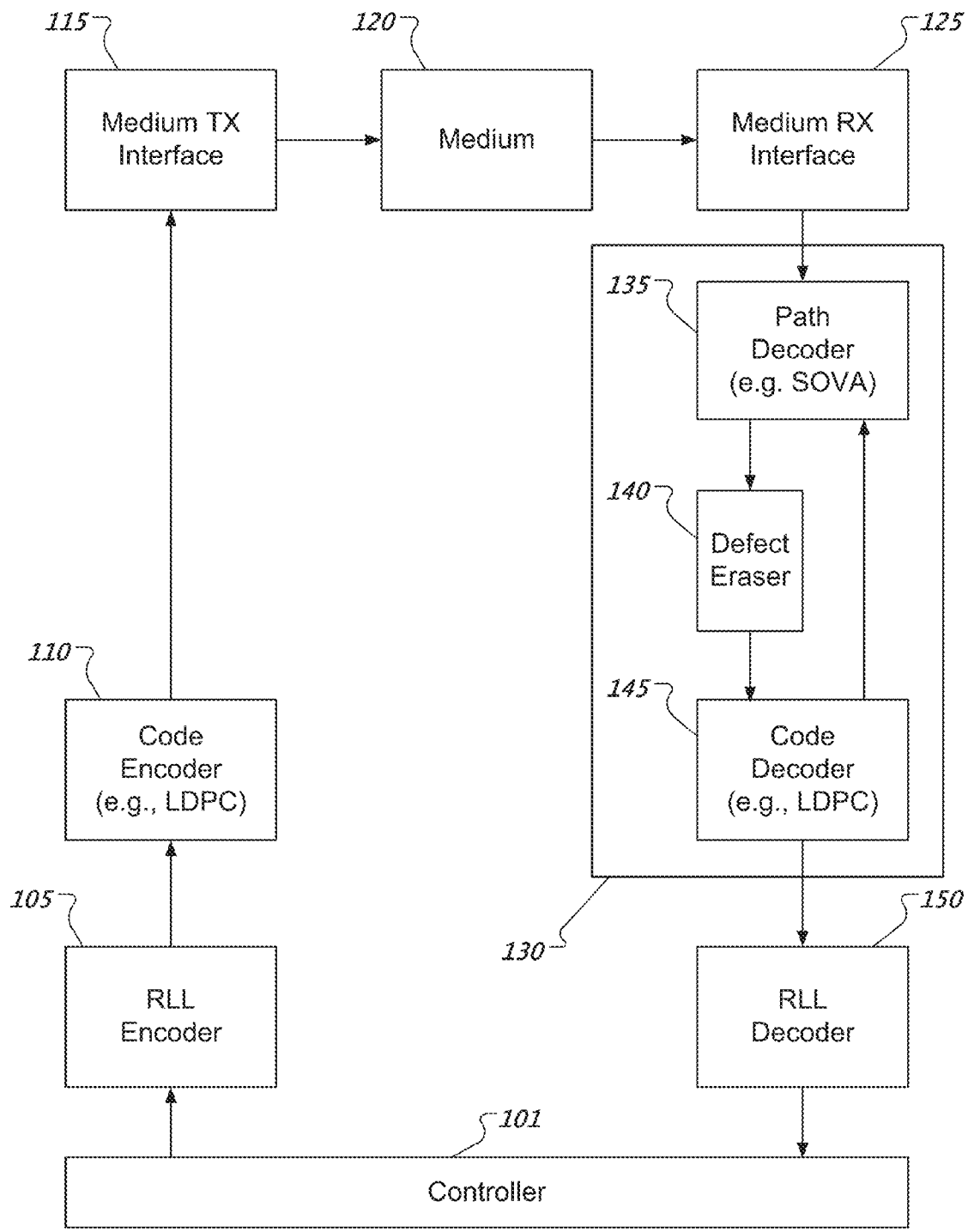
FIG. 1 shows a diagram of an example of an encoding and decoding architecture.

FIG. 1 shows a diagram of an example of an encoding and decoding architecture. A storage system can include a controller 101 that is configured to provide a data stream to an encoder such as a run-length limited (RLL) encoder 105, which produces one or more RLL encoded codewords. Other types of encoders 105 are possible. The controller 101 can operate a code encoder 110 to encode the one or more RLL encoded codewords for storage by using an error correction code (ECC) technique. For example, the code encoder 110 can include a low density parity check (LDPC) encoder or a turbo code encoder. An LDPC code, for example, is an ECC used to protect data against errors when storing data via a noisy medium such as medium 120. The code encoder 110 can output one or more encoded codewords, that will be written to the medium 120 via the medium TX interface 115. The medium 120 can be one or more storage disks such as magnetic storage disks or optical storage disks. Other types of mediums are possible.

A medium RX interface 125 reads an analog signal from the medium 120. The analog signal can be sampled to produce one or more sampled codewords. In some implementations, the medium RX interface 125 includes an analog-to-digital converter (ADC), a finite impulse response (FIR) filter, and a FIR memory. In some implementations, an analog signal received via the medium 120 can be initially filtered, and the filtered analog signal is sampled by the ADC. The ADC samples can be equalized by the FIR filter and provided to a decoder system 130 by way of storing data in the FIR memory. In some implementations, the FIR filter can be configured to generate FIR sample codewords from a received encoded signal via the ADC and store the sample codewords in the FIR memory.

The decoder system 130 can iteratively decode the one or more sampled codewords to produce one or more decoded codewords. The decoder system 130 includes a path decoder 135, a defect eraser 140, and a code decoder 145. The path decoder 135 can be a soft input soft output (SISO) decoder such as a Soft Output Viterbi Algorithm (SOVA) decoder or a Bahl-Cocke-Jelinek-Raviv (BCJR) decoder. SOVA, for example, is based on the classical Viterbi algorithm and uses a modified path metric to take into account the a priori probabilities of input symbols or bits and produces a soft output indicating the reliability of a decision about the input symbols. In some implementations, the path decoder 135 is a hard-output based decoder. Various examples of a code decoder 145 include a LDPC decoder and a turbo code decoder. Other types of code decoders are possible. Based on defect information, the defect eraser 140 can be configured to selectively erase codeword data as the data pass between the path decoder 135 and the code decoder 145 when in a retry mode.

A RLL decoder 150 can perform RLL decoding on the one or more codewords produced by the decoder system 130. A data stream output of the RLL decoder 150 can be provided to a controller 101, which in turn, can provide the data stream to a host.

In some implementations, the path decoder 135 and the code decoder 145, are configured to act together as an iterative decoder. For example, the path decoder 135 and the code decoder 145 can both be configured to iteratively process codeword information and pass resulting information back and forth such that each successive iteration improves overall data accuracy. The path decoder 135 receives the FIR sample codewords and, when available, prior information from the code decoder 145. At an initial iteration, the prior information is set to zero for all bits in the iterative codeword. Based on the received FIR sample codewords and the prior information, the path decoder 135 produces reliability information. Reliability information from the path decoder 135 is forwarded to the code decoder 145. The code decoder 145 generates updated reliability information based on code constraints, and sends the updated reliability information back to the path decoder 135. This process is repeated till a stopping criterion has been met.

In some implementations, the information passed between a path decoder 135, such as a SOVA decoder, and a code decoder 145, such as a LDPC decoder, represents a bit reliability metric, such as a log-likelihood-ratio (LLR) message. The LLR can be obtained using a natural logarithmic function of the ratio of the probability of the value being 1 to the probability of the value being 0 in accordance with this equation:

$$LLR(b_i) = \log\left(\frac{P(b_i = 0)}{P(b_i = 1)}\right)$$

where, $b_i$ represents a bit value. An LLR value can include a sign that indicates whether the transmitted bit is determined to be "0" or "1", and a magnitude representing the confidence of that determination. For example, values of LLR>0 indicate a higher probability that the value of the transmitted bit is 0, whereas values of LLR<0 indicate a higher probability that the value of the transmitted bit is 1. In some implementations, the defect eraser 140, in a retry mode, modifies the data flow between the path decoder 135 and the code decoder 145 by erasing selected data chunks that potentially have defects by setting their signs to zero and their corresponding LLR amplitudes to zero.

An LDPC code that can be decoded by a LDPC decoder can be represented using parity check matrices. An (N, K) LDPC code is a parity check code, where K is the number of bits to be encoded, N is the size (or length) of the resulting coded block and M (N−K) represents the additional error correction bits added by the code. Thus, an LDPC code, C, is specified in terms of a low-density (sparse) M-by-N binary parity check matrix H having dimensions M×N. A binary string, c, of length N is a codeword in the LDPC code C, if and only if $Hc=\vec{0}$ is satisfied. For example, $$H = \begin{bmatrix} 1 & 1 & 1 & 1 & 1 & 1 & 1 \\ 1 & 0 & 1 & 0 & 1 & 0 & 1 \\ 0 & 1 & 0 & 1 & 0 & 1 & 0 \end{bmatrix}$$

where the parity check matrix H is shown for a binary LDPC code with N=7 and K=5. Then, the binary string c=(1,0,1,0, 1,0,1)$^T$ is a codeword in the LDPC code C. The codeword, c, is generated by introducing redundancy bits. For example, an LDPC encoder receives a word of length K and outputs a codeword (e.g., codeword c) of length N by inserting N−K redundancy bits into the received word. Each bit of an LDPC codeword, c, corresponds to a column of the parity check matrix H. For example, bit 1 corresponds to the 1st column of matrix HL 2 corresponds to the second column of matrix H, etc. In some implementations, a binary LDPC code can be used. In some implementations, a non-binary LDPC code can be used.

Figure 2:
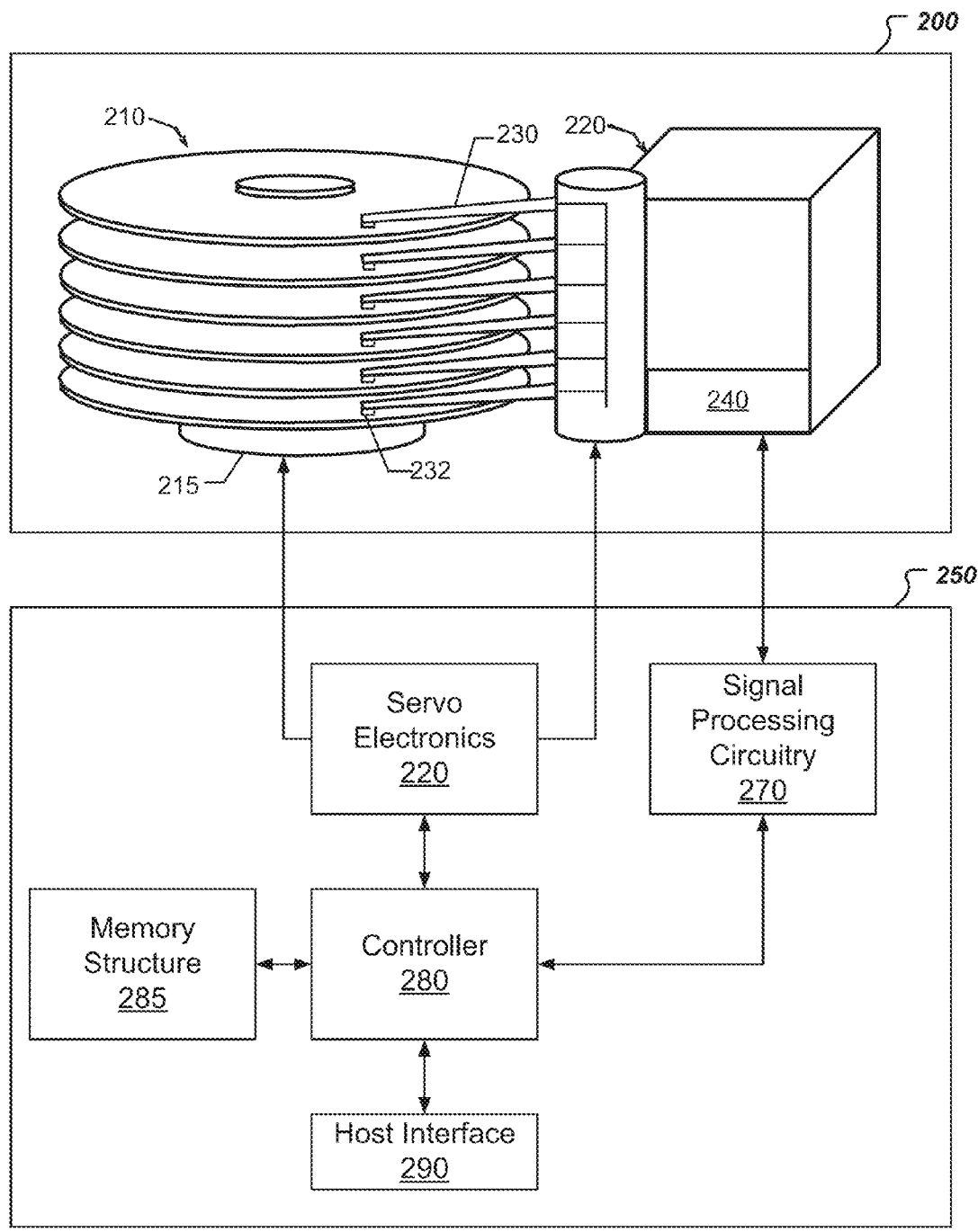
FIG. 2 shows an example of a disk drive system.

FIG. 2 shows an example of a disk drive system. The disk drive includes a head-disk assembly (HDA) 200 and drive electronics 250 (e.g., a printed circuit board assembly (PCBA) with semiconductor devices). The disk drive can include a magnetic recording medium, which can include one or more disks. A disk 210 can be coated with a magnetically hard material (e.g., a particulate surface or a thin-film surface) and can be written to, or read from, a single side or both sides of each disk.

The HDA 200 includes one or more disks 210 mounted on an integrated spindle and motor assembly 215. The integrated spindle and motor assembly 215 includes a spindle motor to rotate the disks 210. The spindle and motor assembly 215 rotates the disk(s) 210 under one or more drive heads 232 that are mechanically coupled with ahead assembly 220 in the HDA 200. A drive head 232 can include one or more magnetic transducers. In some implementations, a drive head 232 includes a read head and a write head. The read head and the write head can be located at different portions of the drive head 232. For example, the read head can be physically offset from the write head.

A drive head 232 on an arm 230 can be positioned as needed to read or write data on the disk 210. A motor, such as a voice coil motor (VCM), can be used to position the drive head 232 over a target track on a disk 210. The arm 230 can be a pivoting or sliding arm and can be spring-loaded to maintain a proper flying height for the drive head 232 in any drive orientation. The HDA 200 can include a preamp/writer 240, where head selection and sense current value(s) can be set. The preamp/writer 240 can amplify a read signal before outputting it to signal processing circuitry 270. Signals between the HDA 200 and drive electronics 250 can be carried through a flexible printed cable.

Drive electronics 250 can include servo electronics 220, signal processing circuitry 270, controller 280, a memory structure 285, and a host interface 290. The signal processing circuitry 270 can include an encoding and decoding architecture such as the one depicted by FIG. 1. In some implementations, the circuitry 270 includes a read signal circuit, a servo signal processing circuit, and a write signal circuit. Controller 280 can include processor electronics such as one or more processors to operate the disk drive. The controller 280 can be configured to perform one or more techniques described herein. A controller 280 can communicate with a memory structure 285 such as anon-volatile memory to retrieve firmware to operate processor electronics. The memory structure 285 can store data such as codeword samples produced by the signal processing circuitry 270. In some implementations, the signal processing circuitry 270 includes a memory structure that stores codeword samples. In some implementations, controller 280 includes a storage area for computer program code and data. In some implementations, controller 280 includes at least a portion of the signal processing circuitry 270.

The controller 280 can be communicatively coupled with an external processor or data bus via the host interface 290 to receive read/write instructions, receive data to write to disk(s) 210, and transmit data read from one or more disks 210. Controller 280 can direct servo electronics 220 to control mechanical operations, such as head positioning through the head assembly 220 and rotational speed control through the motor assembly 215. In some implementations, the controller 280 can be integrated with the servo electronics 220, signal processing circuitry 270, or both. The controller 280 can be implemented as one or more integrated circuits (ICs). Drive electronics 250 can include clock circuitry (not shown) that includes a PLL to produce a servo clock signal and a PLL to produce a write clock signal. The host interface 290 is configured to communicate with a host. The controller 280 can independently perform a retry process such that the host is not involved.

Figure 3:
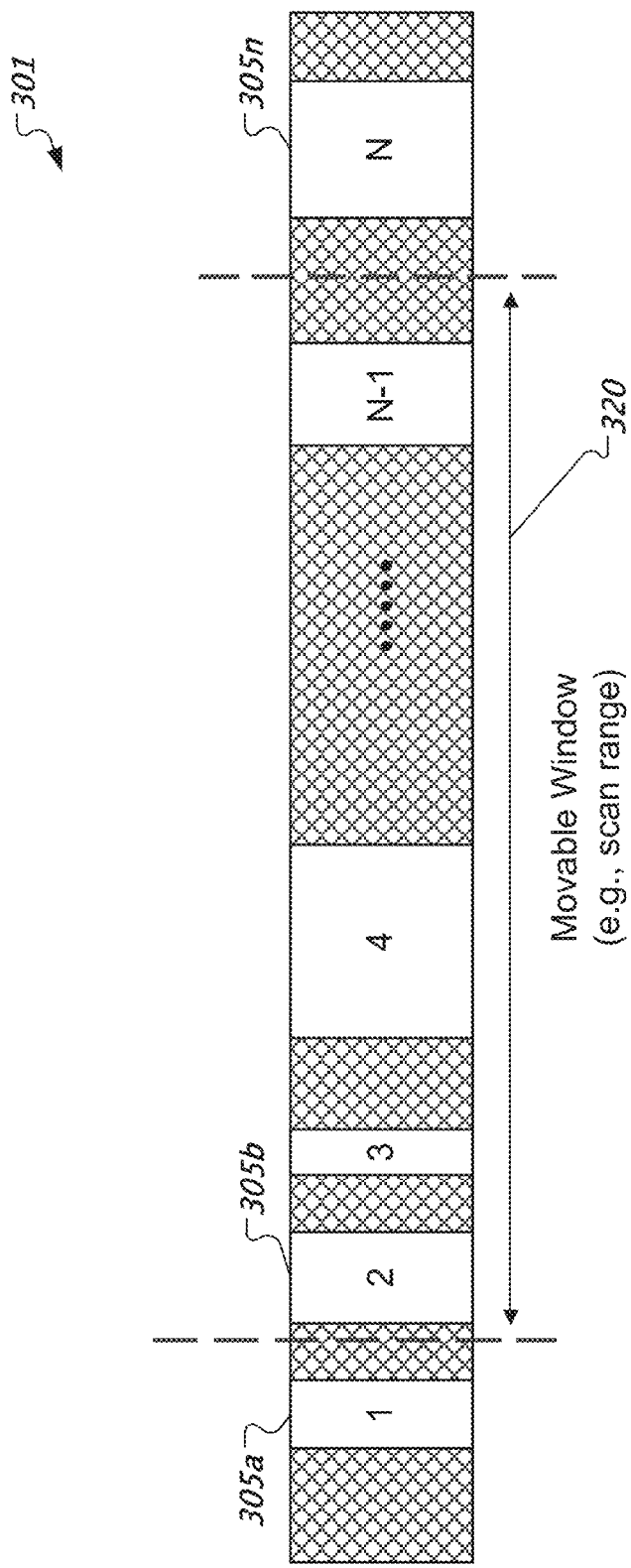
FIG. 3 shows a layout of an example of a retrieved codeword that potentially has multiple defects.

FIG. 3 shows a layout of an example of a retrieved codeword 301 that potentially has multiple defects. A defect identification technique can identify N defect chunks 305*a-n* of a retrieved codeword 301 that potentially have one or more defects. Based on such defect information, a decoder can program information about the N defect chunks 305*a-n* into a memory structure such as one or more programmable registers. Defect chunk information can include a starting location and size of each chunk 305*a-n*. The defect chunks 305*a-n* are independent of the movable window 320, which can be referred to as a scan range. The defect chunks 305*a-n* can overlap with a current placement of the movable window 320. Moreover, different placements of the movable window 320 can include different subsets of the defect chunks 305*a-n*. In some implementations, the N defect chunks 305*a-n* can be reset and disabled as a whole. For example, the defect chunk information can be reset after a completion of a retry process.

The defect chunk information associated with the chunks 305*a-n* can be selectively applied to a codeword during a retry process, such as an internal defect scan operation. The internal defect scan operation can be performed internally by a controller residing on an IC. The internal defect scan operation can iteratively scan defects of any symbols in a codeword. This operation can scan multiple possible locations by sliding a movable window 320 over a data structure containing codeword samples, and applying erasures based on the movable window 320 and the defect chunk information. In some implementations, a defect scan can select one or more defect chunks 305*a-n* within a current placement of the movable window 320 and automatically mask the corresponding bit locations with erasures. The decoding performance can be improved when the defect scan performs an erasure of a defect chunk 305*a-n* that has an actual defect.

Figure 4:
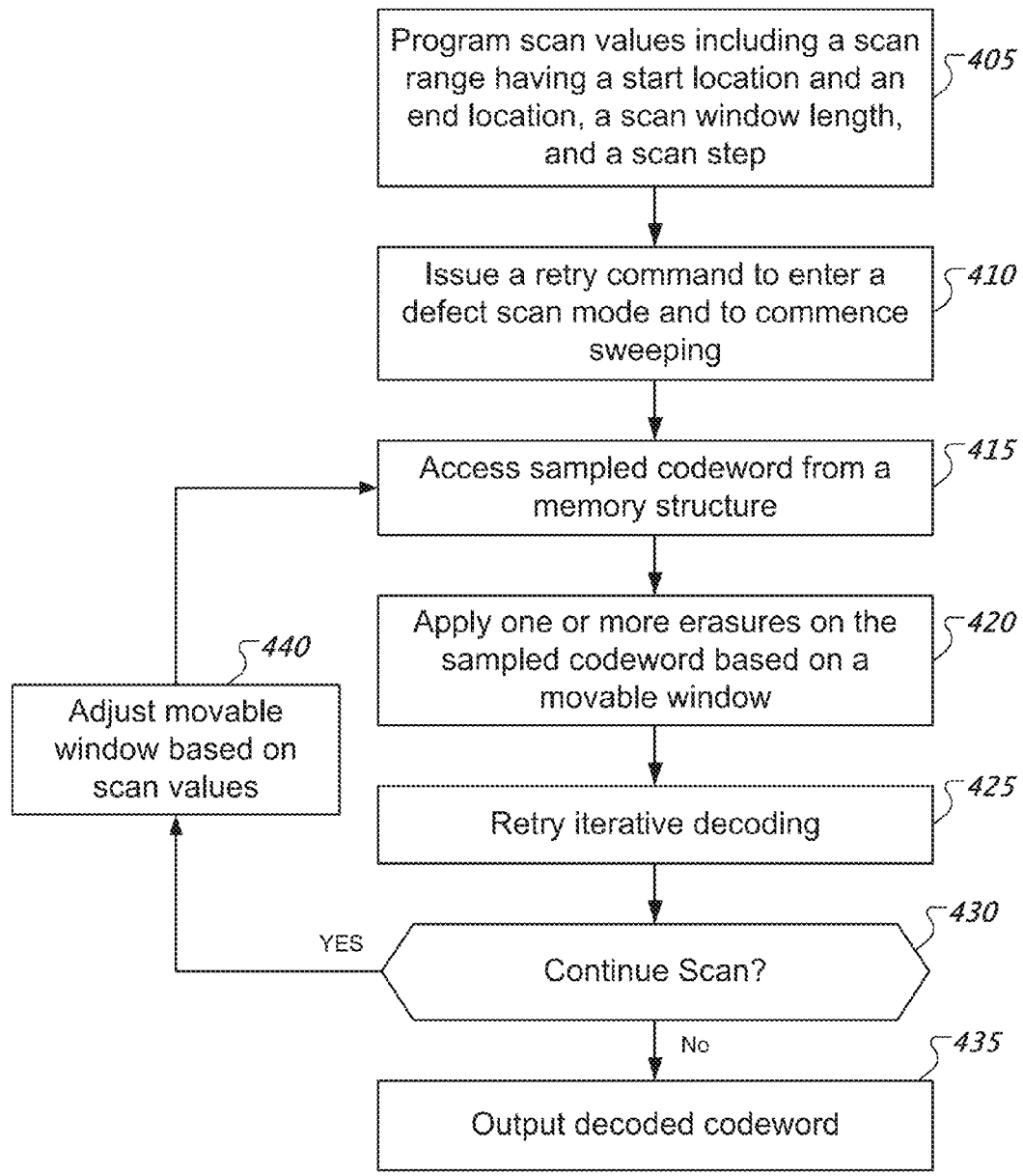
FIG. 4 shows a flowchart of an example of a defect scan process that utilizes a movable window for making erasures.

FIG. 4 shows a flowchart of an example of a defect scan process that utilizes a movable window for making erasures. At 405, the process programs scan values. The values can include a scan range having a start location and an end location, a scan window length, and a scan step. Programming scan values can include setting one or more controller registers. At 410, the process issues a retry command to enter a defect scan mode and to commence sweeping. At 415, the process accesses a sampled codeword from a memory structure. Accessing a sampled codeword can include reading samples from a FIR memory. At 420, the process applies one or more erasures on the sampled codeword based on a movable window. At 425, the process retries iterative decoding. At 430, the process determines whether to continue scanning at 415. If the scanning continues, then the process at 440 adjusts the movable window based on scan values such that the process applies a different set of erasures based on the adjusted movable window at 420. In some implementations, the scanning stops when the codeword is successfully decoded or when the process reaches the end location. If the scanning stops because of a successful decode, the process, at 435, outputs the decoded codeword. In some implementations, parameters such as scan window length and scan step are user-programmable, and can be changed during retry.

While performing a retry process, a drive controller can retrieve one or more additional codewords from the storage medium during the retry process, the one or more additional codewords being different from the codeword associated with the retry process. Hence, the retry process's codeword is not retrieved from the storage medium during the retry process, but rather from a memory structure. In some implementations, a decoding system can include multiple decoding pipelines such that a storage channel's minimum throughput can be guaranteed by operating the storage system to retrieve additional codewords during a retry process. This can enable tough codewords to be solved, e.g., successfully decoded in a retry process, without affecting a storage system's read pipeline. In some implementations, a retry process can combine fixed erasing chunks with a movable window that iteratively sweeps a tough codeword from a start location to an end location.

Figure 5:
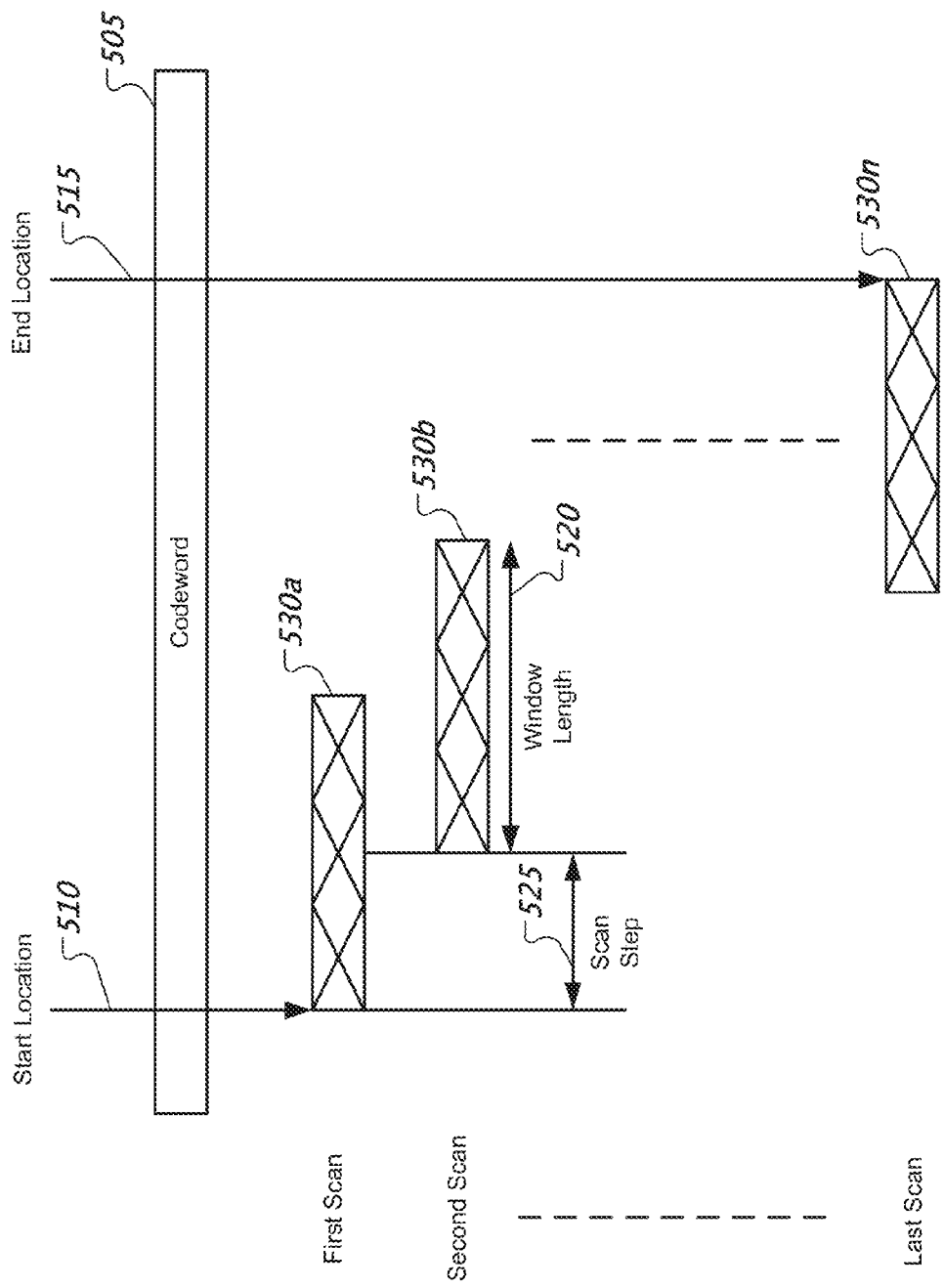
FIG. 5 shows a timing diagram associated with an example of a defect scan process.

FIG. 5 shows a timing diagram associated with an example of a defect scan process. The defect scan process can scan a codeword 505. The defect scan process can perform scans based on a start location 510, end location 515, window length 520, and scan step size 525. The scan ranges 530*a-n* can begin at the start location 510 and end at the end location 515. In some implementations, the codeword 505 is represented by an array of values. The start and end locations 510, 515 can be represented by respective array indices. The window length 520 and the scan step size 525 can be expressed as a number of array elements.

Figure 6:
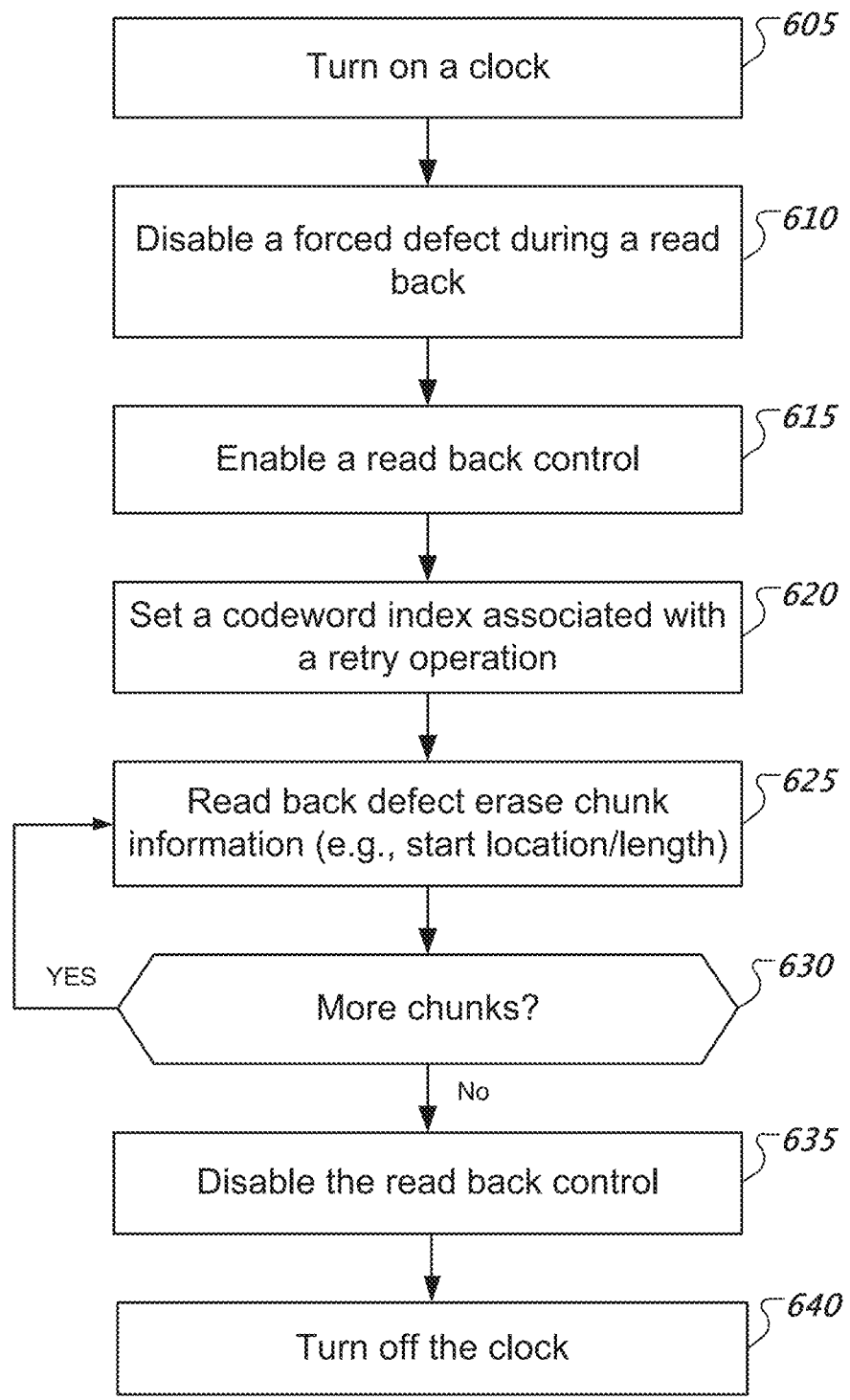
FIG. 6 shows a flowchart of an example of an erase chunk location review process.

FIG. 6 shows a flowchart of an example of an erase chunk location review process. At 605, the process turns on a clock. At 610, the process disables a forced defect during a read back. At 615, the process enables a read back control. At 620, the process sets a codeword index associated with a retry operation. At 625, the process reads back defect erase chunk information. Such information can include a start location and a chunk length. In some implementations, the start location is based on the codeword index associated with a retry process. Reading back a defect erase chunk can include accessing a register that stores defect chunk erasure information. At 630, the process determines whether there are more chunks to read back. If so, the process continues at 625, otherwise the process continues at 635. The process, at 635, disables the read back control. At 640, the process turns off the clock.

Figure 7:
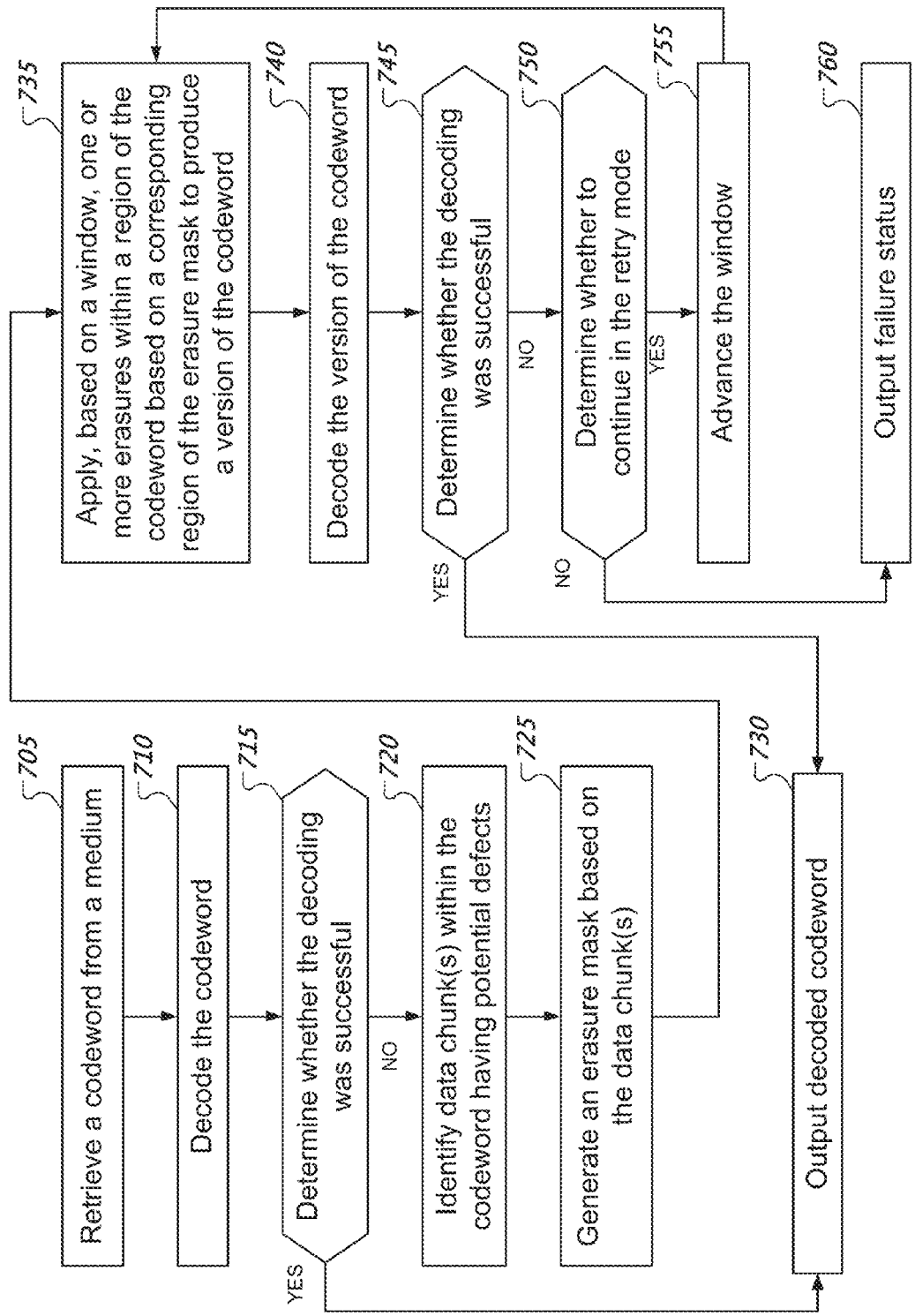
FIG. 7 shows a flowchart of an example of a decoding process that includes a retry process.

FIG. 7 shows a flowchart of an example of a decoding process that includes a retry process. At 705, the process retrieves a codeword from a medium. Retrieving a codeword from a medium can include causing an ADC to sample a waveform produced by a read head moving over a recording medium, and accessing samples produced by the ADC, and subsequently filtered by a FIR filter. The FIR filter samples can be stored in a memory structure such as a FIR memory. At 710, the process decodes the codeword. Decoding the codeword can include iteratively processing codeword information and exchanging information between a path decoder and a code decoder. In some implementations, the path decoder includes a SOVA decoder, and the code decoder includes a LDPC decoder. Other combinations of decoders are possible.

At 715, the process determines whether the decoding was successful. Determining whether the decoding was successful at 715 can include accessing a decoding confidence value produced by a decoder and comparing the value with a threshold value. Based on the decoding being successful, the process, at 730, outputs a decoded codeword.

Based on the decoding not being successful, the process can enter a retry mode. Within the retry mode, at 720, the process identifies one or more data chunks within the codeword having potential defects. In some implementations, such data chunks are identified in a normal read mode before entering the retry mode. In the normal read mode, the process can use a defect detector that works on-the-fly. In the retry mode, the process can use another defect detector to identify potentially defective data chunks.

At 725, the process generates an erasure mask based on the one or more data chunks. Generating an erasure mask can include producing a list of one or more starting locations for each of the one or more data chunks with corresponding ending locations and/or corresponding chunk lengths. Other techniques for representing an erasure mask are possible. For example, an erasure vector of ones and/or zeros can be generated, where a zero value indicates that a corresponding bit, or groups of bits within a codeword should be erased.

At 735, the process applies, based on a window, one or more erasures within a region of the codeword based on a corresponding region of the erasure mask to produce a version of the codeword. Producing a version of the codeword can include providing a modified codeword as input to a decoder. The current placement of the window controls which portion of the erasure mask to apply to the codeword. Applying one or more erasures can include multiplying a portion of a vector containing samples of the codeword with a portion of an erasure vector. In some implementations, applying one or more erasures can include reading the non-erased parts of a codeword sample vector from a memory structure, and filling in zeros for the erased parts of the codeword sample vector based on the current placement of the window.

At 740, the process decodes the version of the codeword. Decoding the version of the codeword can include iterative decoding. For example, decoding can include iteratively processing codeword information and exchanging information between a path decoder and a code decoder. In some implementations, a defect erasure unit coupled between the path decoder and the code decoder applies the erasures, where the path decoder produces LLR information and the code decoder uses the LLR information. For example, applying the one or more erasures can include operating the defect erasure unit to produce modified LLR information by setting to zero one or more LLR values. Such LLR values can be produced by the path decoder. The code decoder can be configured to receive the modified LLR information.

At 745, the process determines whether the decoding at 740 was successful. Determining, at 745, whether the decoding was successful can include accessing a decoding confidence value produced by a decoder and comparing the value with a threshold value. When successfully decoded, the process outputs a decoded codeword at 730. When unsuccessfully decoded, the process, at 750, determines whether to continue in the retry mode. In some implementations, the process includes iteratively moving a window from a start location to an end location based on a window length parameter and a stepping size parameter, where each placement of the window corresponds to one of the one or more regions of the codeword. Determining whether to continue the retry can include determining whether an ending position of the present window has reached an end location. In some implementations, determining whether to continue the retry can include comparing a value of a retry counter with a threshold value. If the retry continues, then the process advances the window at 755, and continues at 735. If the retry ceases, then the process outputs a failure status at 760. The failure status can indicate a decoding failure. In some implementations, the process can retrieve additional codewords from the medium during the retry process to maintain drive throughput.

Figure 8:
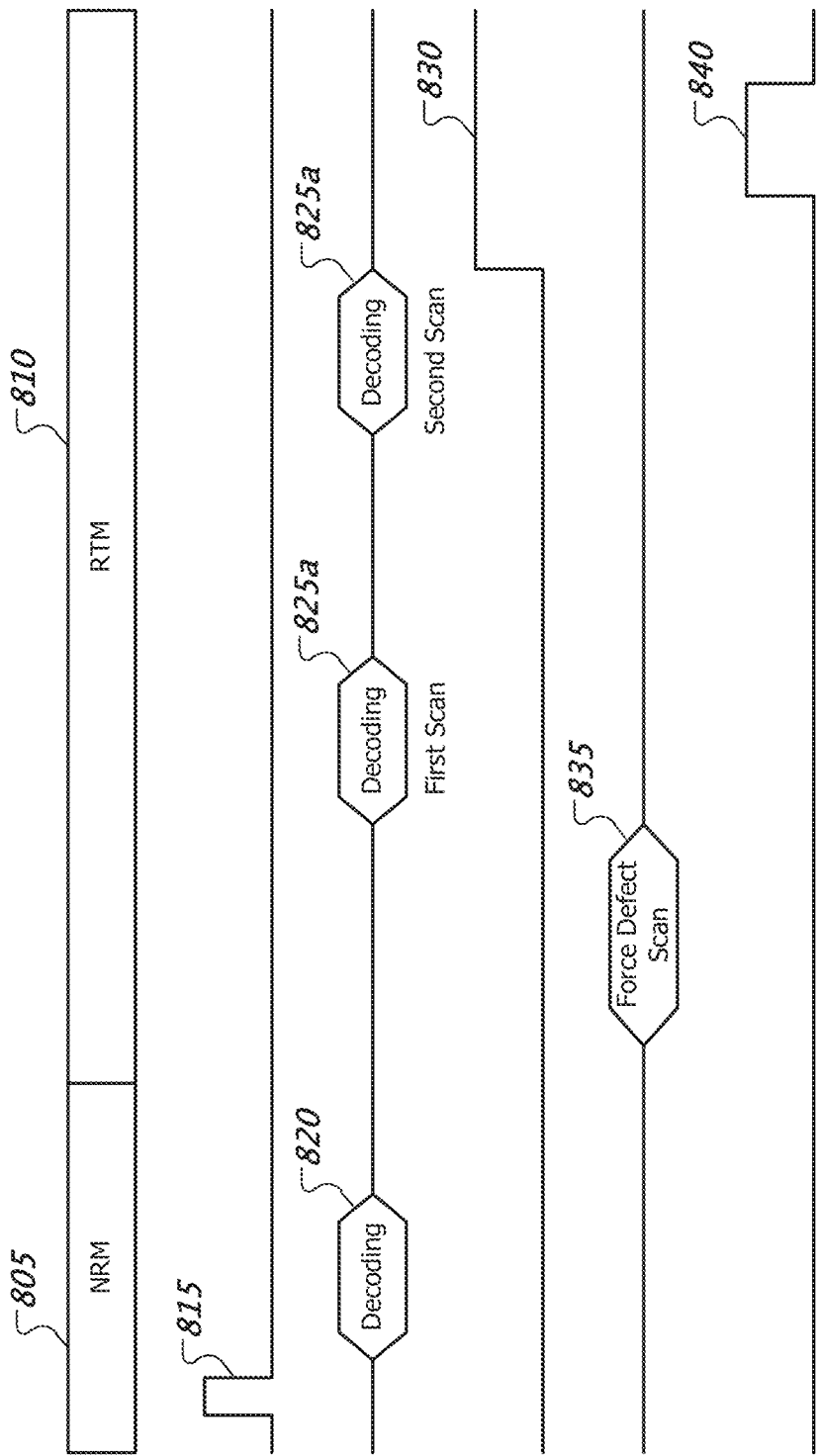
FIG. 8 shows a timing diagram associated with another example of a defect scan process.

FIG. 8 shows a timing diagram associated with another example of a defect scan process. During a normal read mode (NRM) 805, a read gate signal 815 causes a codeword to be retrieved from a storage medium, and subsequently decoded 820. If the codeword is not successfully decoded, then a controller issues a force defect scan command 835 which causes one or more decodes 825a-b of the codeword in a retry mode (RTM) 810. Note that the same codeword is not read again from the storage medium during the retry mode 810, however, other codewords can be retrieved from the storage medium. A controller can apply a first set of erasures to generate a first version of the codeword for the first decode 825a in the retry mode 810. If decoding of the first version fails, the controller can apply a second set of erasures to generate a second version of the codeword for the second decode 825b in the retry mode 810. Based on the second decode 825b being successful, a codeword found signal 830 is asserted, and subsequently a valid decoded data signal is asserted 840 to cause the decoded data to be read from the decoding system and provided to a host via a host interface.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method comprising:
   retrieving a first codeword from a storage medium;
   decoding the first codeword;
   programming registers with information comprising multiple different locations of fixed defect chunks, a window length parameter, and a stepping size parameter;
   performing a retry process when the decoding was not successful; and
   retrieving one or more second codewords from the storage medium during the retry process to at least maintain a drive throughput, the one or more second codewords being different from the first codeword, wherein the first codeword is not retrieved from the storage medium during the retry process, and
   wherein the retry process comprises:
      decoding one or more versions of the first codeword, wherein decoding the one or more versions of the first codeword comprises:
         applying first erasures based respectively on the locations of the fixed defect chunks, and one or more second erasures based on one or more placements of a window that correspond to the one or more versions of the first codeword; and
         iteratively moving the window from a start location to an end location based on the window length parameter and the stepping size parameter to produce the one or more placements of the window.

2. The method of claim 1, wherein decoding the one or more versions of the first codeword comprises iteratively processing codeword information and exchanging information between a path decoder and a code decoder.

3. The method of claim 2, wherein the applying comprises producing modified log-likelihood-ratio (LLR) information by setting to zero one or more LLR values, the one or more LLR values being produced by the path decoder, and wherein the code decoder is configured to receive the modified LLR information from the path decoder.

4. The method of claim 2, wherein the path decoder includes a soft output Viterbi algorithm (SOVA) decoder, and wherein the code decoder includes a low density parity check (LDPC) decoder.

5. An apparatus comprising:
   an interface configured to communicate with a host;
   a memory structure configured to store information retrieved from a storage medium, the information comprising a first codeword;
   registers configured to store multiple different locations of fixed defect chunks, a window length parameter, and a stepping size parameter; and
   circuitry configured to decode the first codeword, selectively perform a retry process that is independent of the host if a decode of the first codeword was not successful, and selectively retrieve one or more second codewords from the storage medium during the retry process to at least maintain a drive throughput, the one or more second codewords being different from the first codeword, wherein the first codeword is not retrieved from the storage medium during the retry process, and
   wherein the retry process comprises accessing at least a portion of the first codeword from the memory structure, and decoding one or more versions of the first codeword, and wherein decoding the one or more versions of the first codeword comprises:
      applying first erasures based respectively on the locations of the fixed defect chunks, and one or more second erasures based on one or more placements of a window that correspond to the one or more versions of the first codeword; and
      iteratively moving the window from a start location to an end location based on the window length parameter and the stepping size parameter to produce the one or more placements of the window.

6. The apparatus of claim 5, wherein decoding the one or more versions of the first codeword comprises iteratively processing codeword information and exchanging information between a path decoder and a code decoder.

7. The apparatus of claim 6, wherein the applying comprises producing modified log-likelihood-ratio (LLR) information by setting to zero one or more LLR values, the one or more LLR values being produced by the path decoder, and wherein the code decoder is configured to receive the modified LLR information from the path decoder.

8. The apparatus of claim 6, wherein the path decoder includes a soft output Viterbi algorithm (SOVA) decoder, and wherein the code decoder includes a low density parity check (LDPC) decoder.

9. A system comprising:
   a storage medium; and
   a controller comprising registers configured to store information comprising multiple different locations of fixed defect chunks, a window length parameter, and a stepping size parameter, wherein the controller is configured to retrieve a first codeword from the storage medium, decode the first codeword, selectively perform a retry process if a decode of the first codeword was not successful, and selectively retrieve one or more second codewords from the storage medium during the retry process to at least maintain a drive throughput, the one or more second codewords being different from the first codeword, wherein the first codeword is not retrieved from the storage medium during the retry process, and
   wherein the retry process comprises accessing at least a portion of the first codeword, and decoding one or more versions of the first codeword, and wherein decoding the one or more versions of the first codeword comprises:
      applying first erasures based respectively on the locations of the fixed defect chunks, and one or more second erasures based on one or more placements of a window that correspond to the one or more versions of the first codeword; and
      iteratively moving the window from a start location to an end location based on the window length parameter and the stepping size parameter to produce the one or more placements of the window.

10. The system of claim 9, wherein the controller comprises a path decoder and a code decoder, and wherein decoding the one or more versions of the first codeword comprises iteratively processing codeword information and exchanging information between the path decoder and the code decoder.

11. The system of claim 9, wherein the applying comprises producing modified log-likelihood-ratio (LLR) information by setting to zero one or more LLR values, the one or more LLR values being produced by the path decoder, and wherein the code decoder is configured to receive the modified LLR information from the path decoder.

12. The system of claim 10, wherein the path decoder includes a soft output Viterbi algorithm (SOVA) decoder, and wherein the code decoder includes a low density parity check (LDPC) decoder.

\* \* \* \* \*